Figure 10:
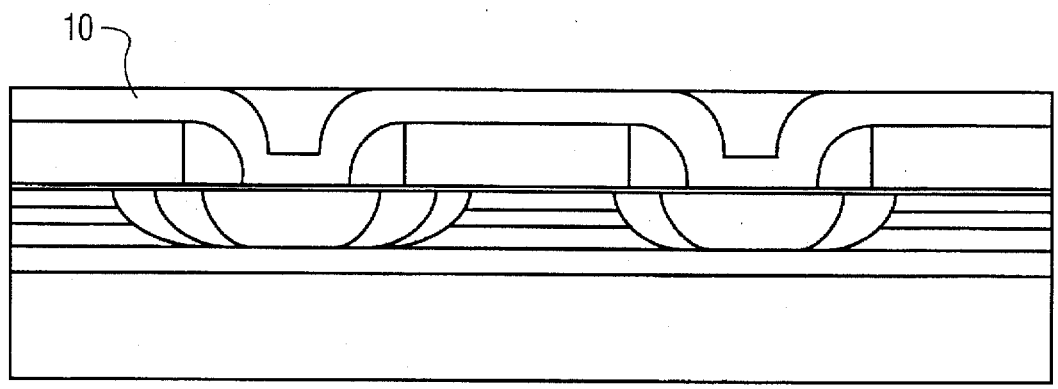

United States Patent [19]
Kim

[11] Patent Number: 5,681,761
[45] Date of Patent: Oct. 28, 1997

[54] MICROWAVE POWER SOI-MOSFET WITH HIGH CONDUCTIVITY METAL GATE

[75] Inventor: Manjin J. Kim, Hartsdale, N.Y.

[73] Assignee: Philips Electronics North America Corporation, New York, N.Y.

[21] Appl. No.: 580,409

[22] Filed: Dec. 28, 1995

[51] Int. Cl.[6] .......................... H01L 21/265; H01L 27/12
[52] U.S. Cl. .................. 437/21; 437/29; 437/192
[58] Field of Search .................. 437/21, 27, 29, 437/44, 45, 40 AS, 41 AS, 62, 190, 192, 913, 933; 257/347, 349, 348, 350–354

[56] References Cited

U.S. PATENT DOCUMENTS

| | | | |
|---|---|---|---|
| 4,173,818 | 11/1979 | Bassous et al. | 437/41 AS |
| 4,382,826 | 5/1983 | Pfleider et al. | 437/27 |
| 4,949,799 | 8/1990 | Blake et al. | 437/41 |
| 5,185,280 | 2/1993 | Houston et al. | 437/46 |
| 5,215,931 | 6/1993 | Houston | 437/40 |
| 5,359,219 | 10/1994 | Hwang | 257/351 |
| 5,371,394 | 12/1994 | Ma et al. | 257/336 |
| 5,384,279 | 1/1995 | Stolmeijer et al. | 437/57 |
| 5,441,906 | 8/1995 | Burger | 437/41 AS |
| 5,482,871 | 1/1996 | Pollack | 257/347 |

FOREIGN PATENT DOCUMENTS

| | | | |
|---|---|---|---|
| 0373893 | 6/1990 | European Pat. Off. | 257/347 |
| 0457596 | 11/1991 | European Pat. Off. | 257/347 |

*Primary Examiner*—John Niebling
*Assistant Examiner*—S. Mulpuri
*Attorney, Agent, or Firm*—Michael E. Marion

[57] ABSTRACT

A technique for making a microwave, high power SOI-MOFET device is set forth together with such a device. An important aspect of this structure is the presence of high conductivity metal gate fingers for the device.

15 Claims, 4 Drawing Sheets

MICROWAVE POWER SOI-MOSFET WITH HIGH CONDUCTIVITY METAL GATE

FIELD OF THE INVENTION

The present invention is directed to high power FET devices using high conductivity gate structures. More particularly, the present invention involves microwave powered SOI devices using a high conductivity metal gate electrode.

CROSS-REFERENCE TO RELATED APPLICATIONS

Attention is directed to related applications by the same inventor, Ser. Nos. 08/579,702 and 08/579,703, filed on the same date as this application.

BACKGROUND OF THE INVENTION

The use of high power, high frequency semiconductor devices in wireless mobile communication systems has become very important. In particular, next generation wireless telephones, operating in the lower Ghz range, such as up to about 3.0 Ghz, for personal communication services (PCS), are being developed.

In such devices parasitic capacitances and resistances must be minimized. Silicon-on-Insulator (SOI) devices have been found to significantly reduce drain-to-substrate and drain-to-source capacitances. Moreover, the self-aligning process of making these devices not only reduces such capacitances but also reduces input resistances for high power gain.

While SOI devices per se have been known for some time, see U.S. Pat. Nos. 5,359,219 and 5,243,213, for example, these structures have not been geared to high frequency, high power uses. These prior devices use poly silicon gate electrodes which limits their use in high power and high frequency applications. Although metal-silicide gate devices have previously been considered, see U.S. Pat. No. 5,252,502, there has not been provided any structures that are useful for microwave power devices, especially since high alignment and etching tolerances are required between gate and source-drain areas, leading to large size devices. Moreover, the use of gate metals has been limited to a silicide metals, such as titanium or cobalt, resulting in silicide-metal gate electrodes that are unstable with the gate oxide during high temperature activation. Thus, the device of the reference does not lend itself to high frequency, high power microwave devices.

SUMMARY OF THE INVENTION

The present invention is directed at a method for manufacturing a high power, microwave frequency SOI device in which a metal gate electrode is used, eliminating high device capacitance and high resistance problems.

The present invention provides a method for making such high power, microwave frequency devices by carrying out the steps of forming a SOI device with a thin silicon layer on a substrate insulated with an oxide, forming a retrograde doping profile of a first conductivity type in the thin silicon layer, forming a plurality of highly conductive metal gate fingers on a gate oxide over the thin silicon layer, forming a self-aligned source-shield of the first conductivity type in a source area adjacent to at least one of the metal gate fingers, forming a source region within the source-shield, forming a drain area in a drain region adjacent to the one metal gate finger at a side opposite to the source region with the source and drain regions being of a second conductivity type, forming an oxide layer over the surface of the thus formed structure, and providing metal contacts to the source and drain areas with the metal gate fingers being connected to a gate bus at one side of the device.

In an embodiment of the present invention the plurality of metal gate fingers are formed with a long gate width relative to a short gate length between source and drain regions with the gate fingers being connected to the metal stems at sides of the device. A refractory metal may be used for the metal stem.

BRIEF DESCRIPTION OF THE DRAWING FIGURES

Figure 1:
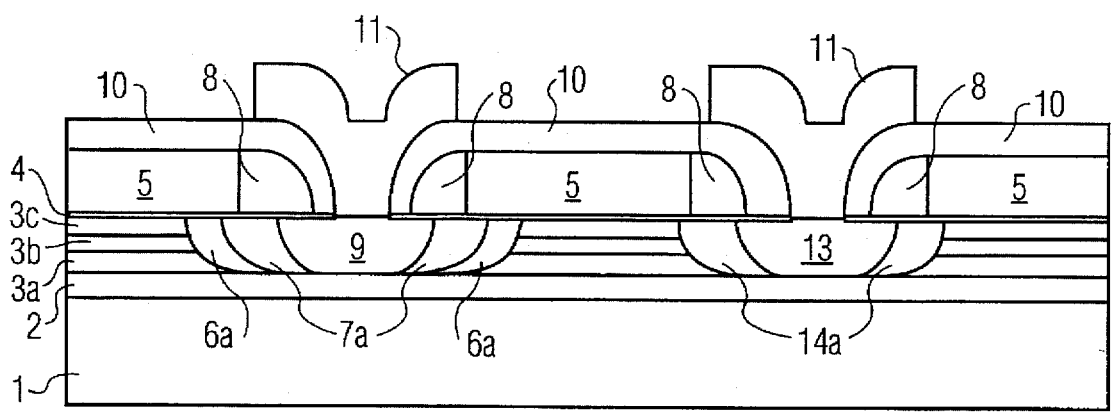
Figure 11:
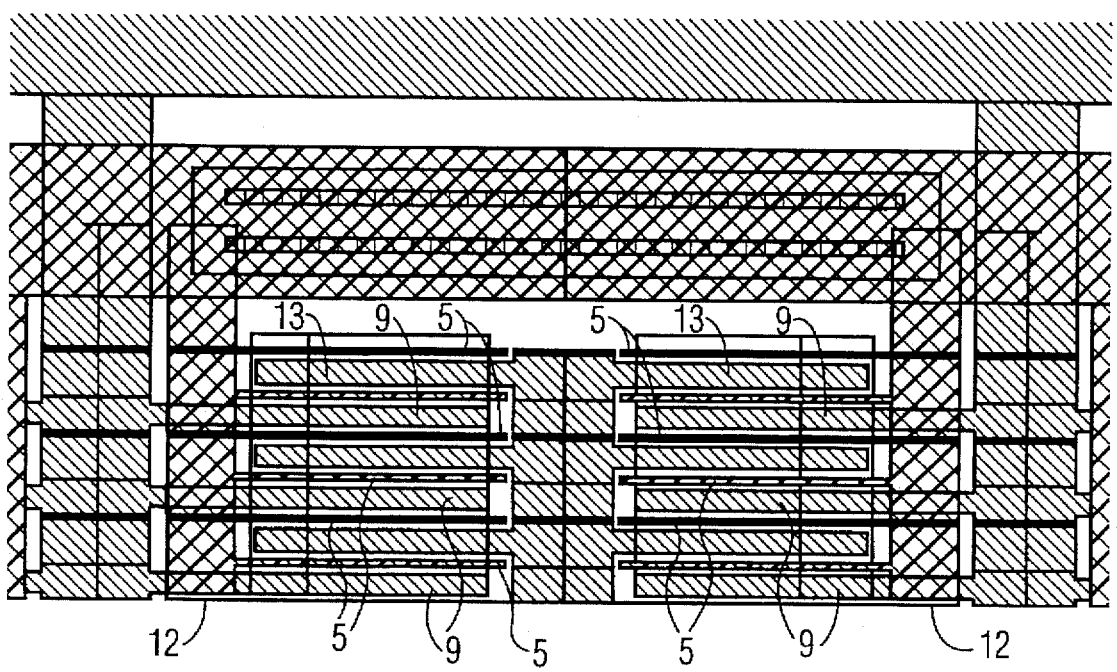

The features and layout of the present invention is shown by way of examples in the following illustrative drawings in which distances and sizes have been changed in order to more clearly show the invention, where:

FIG. 1 shows in cross-section a SOI-MOSFET high power microwave device according to the present invention, FIGS. 2, 3, 4, 5, 6, 7, 8, 9 and 10 show schematic views in the process of making the device of FIG. 1, and FIG. 11 shows in top view the gate fingers of the device made by the present invention.

DESCRIPTION OF THE INVENTION

The structure of the present invention is shown in cross-section in FIG. 1. In this structure a high resistance substrate 1 of a material, such as silicon, is formed with an isolation oxide layer 2 and a very thin silicon layer 3 to form an SOI base structure. The oxide layer 2 may be of a silicon dioxide material or any other appropriate oxide. The very thin layer of silicon 3 has a graded doping structure including a bottom layer 3a of p-type conductivity, for example, with a middle layer 3b of p type conductivity and a top layer 3c of p-type conductivity.

Overlying this structure is a thin gate oxide layer 4 of silicon oxide, for example, and a number of separated metal gate fingers 5. The metal gate fingers may be of high conductivity refractory metal, such as molybdenum, and are provided in a comb-shape with long fingers stretching from a metal stem 12, such as seen in FIG. 11. This structure eliminates contact formation on each finger, thereby simplifying the design and process of formation. The gate fingers may be about 30 microns in length and have a gate resistance of less than 3.0 ohms for microwave operation. The use of refractory metals, such as molybdenum, for example, reduces the gate resistance to about 0.11 ohm/cm$^2$ which is an order of magnitude less than that for conventional polysilicon gates having silicides. It is then very possible to operate in the low giga-hertz range for personal telephones, for example.

The subsequent structure of the semiconductor device of the present invention is further seen in FIG. 1 as including a p type source-shield 6a, completely surrounding the source region 7a, 9 to protect it from punch-through of space charge spreading from the drain region 13, 14a, both source and drain regions being of an n conductivity type, for example. The source region 7a, 9 is provided within the source-shield 6a. Oxide spacers 8 are disposed in the spaces between the metal gate fingers 5 to limit the size of the exposed n+ conductivity source and drain areas 9 and 13. A thick oxide layer 10 is provided over the structure with openings to attach source and drain contacts 11 of a conductive metal.

Figure 2:
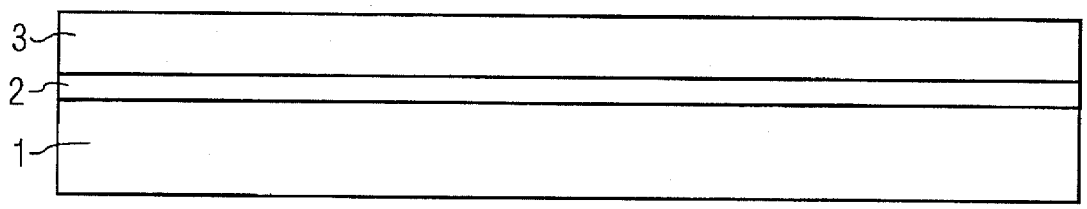
Figure 3:
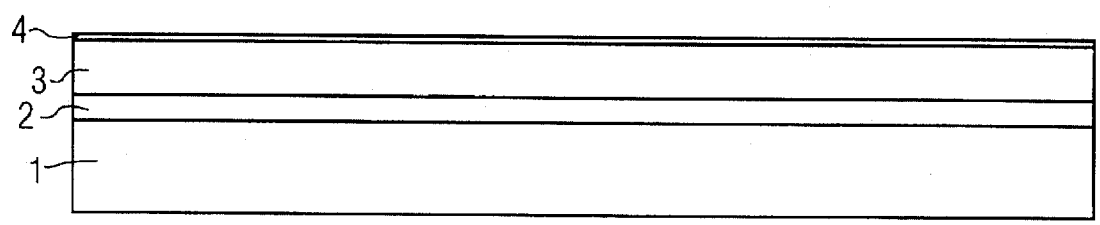

This semiconductor structure is formed by the process as illustrated in FIGS. 2–10. Thus, as seen in FIG. 2, the SOI device is first formed by providing a buried oxide layer 2 on a high resistance silicon substrate 1 over which a very thin silicon layer 3 is formed. The oxide layer 2 may have a thickness of about 2 microns while the very thin silicon layer 3 of the SOI device may have a thickness of about 1.5 microns. Thereafter, as seen in FIG. 3, a thin thermal gate oxide layer 4 is provided on the thin silicon layer 3. By subsequent retrograde double diffusion or implantation, a middle layer 3b of p type conductivity is formed above the p-layer 3a, followed by an implantation to provide the top layer 3c of p-conductivity type material.

Figure 4:
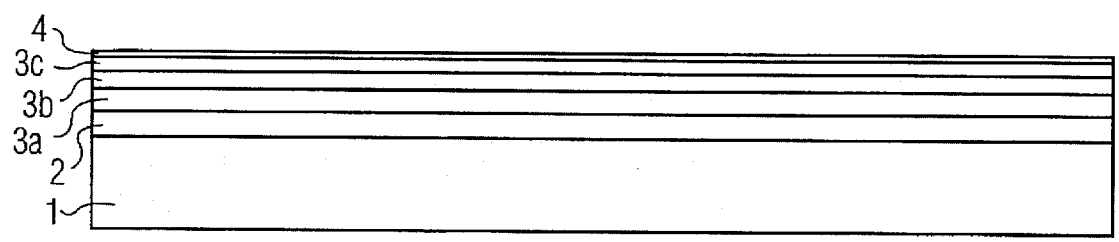
Figure 5:
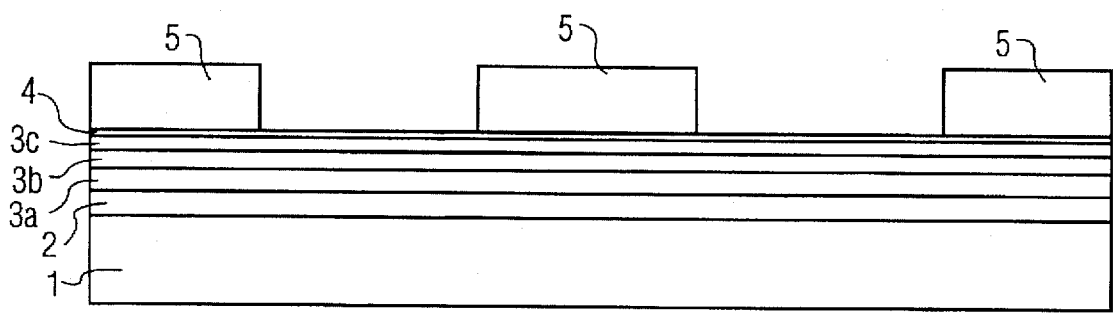
Figure 6:
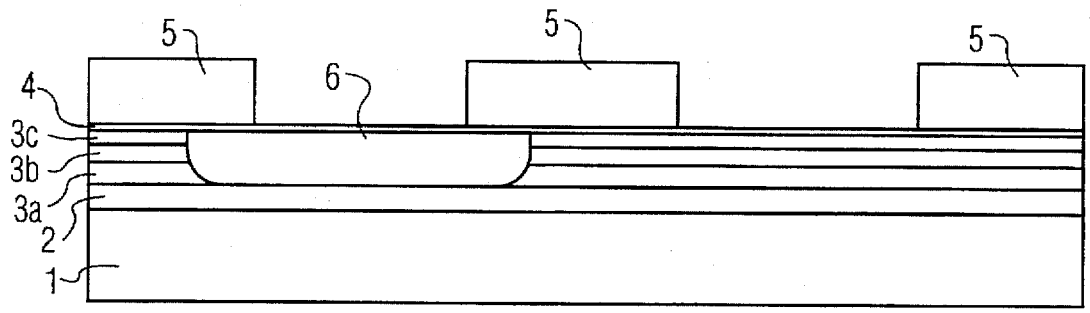

High conductivity refractory metal gate fingers 5, shown in FIG. 5, are then formed on the thermally grown gate oxide 4, shown in FIG. 4. The metal gate fingers 5 are formed by a photolithographic patterning of a refractory metal layer and then etching away regions of the metal layer to form the fingers 5. Then a double diffusion is carried out through the openings between alternate fingers to form a p type cup or ring type source-shield, depending on the diffusion depth to the SOI thickness, as seen in FIG. 6 which will completely surround the subsequently formed source region to protect the source from punch-through of space charge from the drain. This source shield can be provided by a self aligned diffusion through the source window between gate fingers defining the source regions. The punch-through voltage can be increased by adjusting the doping level into the source-shield 6. When the overlap of the double diffusion of the SOI layer with the gate is minimized, the majority part of the channel beneath the gate remains lightly doped to minimize the voltage drop across the channel region by maintaining a uniform field to achieve velocity saturation.

Figure 7:
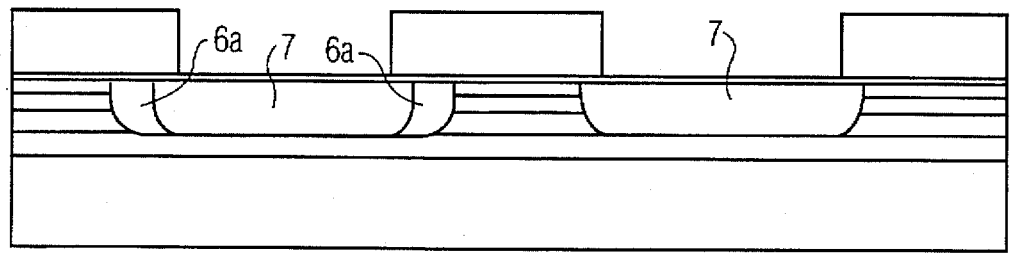
Figure 8:
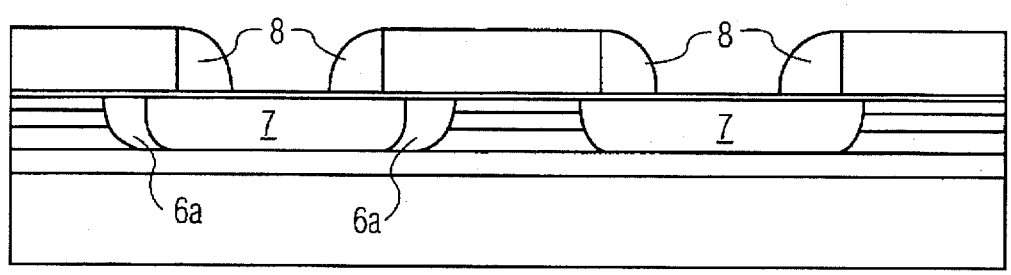
Figure 9:
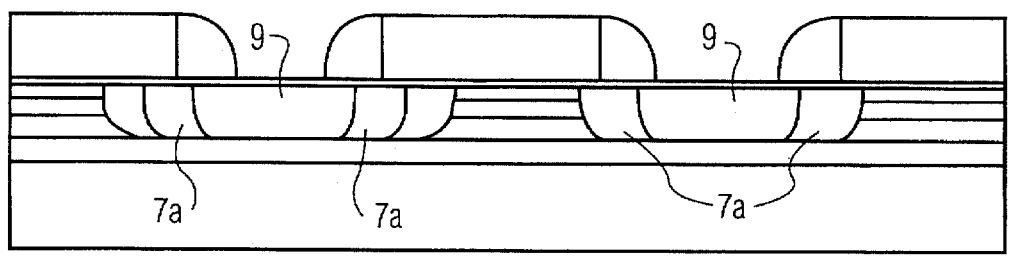

Subsequently, n type conductivity doping is carried out between the gate fingers to form source and drain regions 7, as seen in FIG. 7, followed by the formation of oxide spacers 8, seen in FIG. 8, by anisotropic RIE etching of an oxide layer provided over the structure after the n conductivity doping to form the source and drain regions 7. A further implantation of n+ doping is then carried out between the spacers 8, as seen in FIG. 9, to form good conductivity source and drain areas 9 and 13 for good ohmic contact with source and drain conductors. Then, a thick oxide layer 10 is deposited over the structure, as seen in FIG. 10, and openings in the layer 10 are provided for forming conductive contacts 11, mainly of metal, for the source and drain areas 9 and 13.

The present invention provides high conductivity refractory metal for the gate by way of a comb-like structure with long thin fingers 5 stretching out from a metal stem 12, as shown in FIG. 11. This eliminates contact formation between each finger to the metal gate stem and simplifies the design and process. An ideal layout topology can provide gate finger lengths of up to about 30 microns and the total gate resistance of metal stems across the device, fingers from the stem, and the bus lines along the sides of the device, as shown in FIG. 11, can be made less than 3.0 ohms which is necessary for microwave operation. Thus, a metal gate is a logical choice for a microwave MOSFET gate where the metal is a refractory metal with molybdenum being the most reliable gate material.

The use of molybdenum as a gate material is beneficial since molybdenum is stable at high temperature processing in a reducing atmosphere. The presence of oxygen at a high temperature or the presence of an acid in a wet etching process can cause significant problems since the oxygen or acid can attack molybdenum through pinholes in the structure. A conversion of the top parts of the molybdenum to a molybdenum nitride skin greatly reduces attack to the metal and facilitates mass production of the devices. Further, the amorphous molybdenum nitride $Mo_2N$ greatly improves the stopping power of implanting ions, compared with sputtered molybdenum films having a columnar structure, and makes it easier to make a MOSFET in a self-aligned manner. For example, a 2000 A molybdenum gate cannot mask 25 KeV boron ions, whereas 620 A $Mo_2N$ over 1380 A molybdenum can. Therefore, the use of molybdenum nitride not only saves implantation time, but also renders a freedom to control implantation depths with the added advantage of smaller overlap capacitance.

While molybdenum is used as the MOSFET gate by the present invention, it can also be used as the source and drain conductors, as well as cross-over conductors for a more effective layout of the device. The smooth surface of molybdenum produces a better planarized overlay. However, in this case a thin barrier layer below the molybdenum may be necessary because molybdenum does not form a good ohmic contact with silicon. Such barrier layers of Cr, Ti, and TiW have been used but it has been found that TiW forms the best thermal stability with silicon and silicon dioxide. The high thermal stability prevents degradation of the contact resistance up to 650° C., and the thermal resistance properties are very desirable for the high power SOI amplifier whose local temperature can go above 300° C., for example. There is also excellent electromigration resistance since in an accelerated electromigration test at 150° C., the meantime-to-failure (MTF) of Mo/TiW is in excess of 24,000 hours at 3.6E6 A/cm² bias, as compared to 6,000 hours for AlCu (0.5%) at 2.5E6 A/cm².

As an alternative, a LDMOS device can be made to further increase the drain breakdown voltage. In this case the field near the drain is the same as in the drift region so that avalanche breakdown, multiplication and oxide charging are reduced compared with conventional type devices. However, any additional drain-resistance as a trade-off for a higher voltage must be avoided because mobile systems can only accommodate a low voltage source.

What I claim:

1. A method of manufacturing a high power, microwave frequency SOI-MOSFET device comprising the steps of
   (a) forming a SOI device with a silicon layer on a substrate insulated with an oxide,
   (b) forming a retrograde doping profile of a first conductivity type in the silicon layer,
   (c) forming a plurality of metal gate fingers on a gate oxide over the silicon layer, the metal gate fingers comprising molybdenum.
   (d) forming a self-aligned source-shield of the first conductivity type in the silicon layer, the source-shield being disposed adjacent to at least one of the metal gate fingers,
   (e) forming a source region within the source-shield, and
   (f) forming a drain region in the silicon layer, and said drain region being adjacent to the one metal gate finger at a side opposite to the source region with the source and drain regions being of a second conductivity type.

2. A method according to claim 1, wherein said plurality of metal gate fingers are formed with a long gate width to a relatively short gate length.

3. A method according to claim 1, further comprising the step of converting the top part of the molybdenum to molybdenum nitride.

4. A method according to claim 1, wherein at least one of the steps of forming the source-shield, the source region and the drain region comprises ion-implantation and further comprising the step of converting the top part of the molybdenum to a molybdenum compound prior to the ion-implantation step.

5. A method according to claim 4, wherein the step of converting comprises converting molybdenum to molybdenum nitride.

6. A method according to claim 1, further comprising the step of providing molybdenum contacts to at least one of the source and drain regions.

7. A method according to claim 6, further comprising the step of forming a barrier layer between the at least one source and drain region and the molybdenum so as to enhance ohmic contact.

8. A method according to claim 7, wherein the step of forming a barrier layer comprises using one or more of Cr, Ti and TiW.

9. A method according to claim 1, further comprising the step of connecting one or more of the metal gate fingers to a gate stem.

10. A method according to claim 9, wherein the step of connecting the gate fingers to a gate stem comprises using a molybdenum gate stem.

11. A method according to claim 9, further comprising the step of connecting the gate stem to a gate bus.

12. A method according to claim 11, wherein the steps of connecting comprise using molybdenum for at least one of the gate stem and the gate bus.

13. A method according to claim 1, wherein the step of forming a source-shield comprises providing a self-aligned diffusion through the window between adjacent metal gate fingers.

14. A method according to claim 1, wherein one or more of the steps of forming the source-shield, source region and drain region comprise minimizing the overlap between the respective diffusions and the gate defined by the metal gate finger.

15. A method according to claim 1, further comprising the step of forming at least one of a source contact in the source region and a drain contact in the drain region.

* * * * *